United States Patent
Akai et al.

(10) Patent No.: US 10,373,729 B2
(45) Date of Patent: Aug. 6, 2019

(54) COMPOSITION FOR FORMING COAT-TYPE INSULATING FILM

(71) Applicant: DAICEL CORPORATION, Osaka-shi, Osaka (JP)

(72) Inventors: Yasuyuki Akai, Himeji (JP); Youji Suzuki, Himeji (JP); Takeshi Yokoo, Himeji (JP)

(73) Assignee: DAICEL CORPORATION, Osaka-Shi, Osaka (JP)

( * ) Notice: Subject to any disclaimer, the term of this patent is extended or adjusted under 35 U.S.C. 154(b) by 74 days.

(21) Appl. No.: 15/508,772

(22) PCT Filed: Aug. 25, 2015

(86) PCT No.: PCT/JP2015/073860
§ 371 (c)(1),
(2) Date: Mar. 3, 2017

(87) PCT Pub. No.: WO2016/035615
PCT Pub. Date: Mar. 10, 2016

(65) Prior Publication Data
US 2017/0271041 A1    Sep. 21, 2017

(30) Foreign Application Priority Data
Sep. 3, 2014 (JP) ................................ 2014-179447

(51) Int. Cl.
| | | |
|---|---|---|
| C09D 7/20 | (2018.01) | |
| H01B 3/44 | (2006.01) | |
| C09D 145/00 | (2006.01) | |
| H01L 21/02 | (2006.01) | |

(52) U.S. Cl.
CPC .............. H01B 3/441 (2013.01); C09D 7/20 (2018.01); C09D 145/00 (2013.01); H01L 21/02118 (2013.01); H01L 21/02282 (2013.01); C08L 2201/56 (2013.01)

(58) Field of Classification Search
CPC .............................................. C08G 2261/3324
See application file for complete search history.

(56) References Cited

U.S. PATENT DOCUMENTS

| | | | | |
|---|---|---|---|---|
| 2003/0040194 A1* | 2/2003 | Lee | ...................... | C08G 77/62 438/760 |
| 2008/0090176 A1* | 4/2008 | Kusunoki | .......... | C08G 59/3218 430/280.1 |
| 2010/0283044 A1 | 11/2010 | Inoue | | |

FOREIGN PATENT DOCUMENTS

| | | |
|---|---|---|
| JP | 2001-319927 A | 11/2001 |
| JP | 2007-084746 A | 4/2006 |
| JP | 2008-111033 A | 5/2008 |
| JP | 2009-167433 A | 7/2009 |
| JP | 2010-126606 A | 6/2010 |
| JP | 2010-278173 A | 12/2010 |
| JP | 2010-283332 A | 12/2010 |
| JP | 2012-064662 A | 3/2012 |
| WO | WO 2006-043617 A1 | 4/2006 |

OTHER PUBLICATIONS

Daigle, Journal of Polymer Science, Part A: Polymer Chemistry, 2013, 51, p. 2669-2676 (Year: 2013).*
International Search Report (PCT/ISA/210) issued in PCT/JP2015/073860, dated Nov. 17, 2015.
Suganuma et al., Printed Electronics Technology (ISBN 978-4-7693-1280-2), 2009, pp. 46-49.
Written Opinion (PCT/ISA/237) issued in PCT/JP2015/073860, dated Nov. 17, 2015.
Japanese Notice of Reasons of Refusal, dated Sep. 11, 2018, in corresponding Japanese Application No. 2016-546569, along with an English machine translation.
Japanese Notice of Reasons for Refusal, dated Nov. 20, 2018, for corresponding Japanese Application No. 2016-546569, with an English translation.

* cited by examiner

*Primary Examiner* — Robert C Boyle
(74) *Attorney, Agent, or Firm* — Birch, Stewart, Kolasch & Birch, LLP

(57) ABSTRACT

Provided is an insulating coating composition. The composition is highly safe, in which an organic material to form an insulating film is dissolved highly stably. The composition can form an insulating film by coating, where the insulating film has a low relative permittivity, a high insulation resistance, and high wettability and allows an upper layer to be formed thereon by coating. The insulating coating composition according to the present invention contains a cyclic olefin copolymer and a solvent. The cyclic olefin copolymer is a copolymer between a cyclic olefin and a chain olefin. The solvent includes a compound represented by Formula (1) and having a normal boiling point of 100° C. to lower than 300° C. In Formula (1), Ring Z is a ring selected from a 5- or 6-membered saturated or unsaturated cyclic hydrocarbon and a benzene ring; and $R^1$ is selected from a hydrocarbon group and acyl. Ring Z has a substituent or substituents including the $R^1O$ group. When Ring Z has two or more substituents, two of the substituents may be linked to each other to form a ring with a carbon atom or atoms constituting Ring Z.

[Chem. 1]

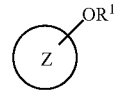

(1)

4 Claims, No Drawings

COMPOSITION FOR FORMING COAT-TYPE INSULATING FILM

TECHNICAL FIELD

The present invention relates to an insulating coating composition (composition for insulating film formation), where the composition includes a solute cyclic olefin copolymer, and a solvent in which the solute is dissolved. The composition has excellent coatability and forms a coat layer that has such wettability as to allow an upper layer to be formed thereon by coating technique. This application claims priority to Japanese Patent Application No. 2014-179447, filed Sep. 3, 2014 to Japan, the entire contents of which are incorporated herein by reference.

BACKGROUND ART

In general, materials to form insulating films are exemplified by inorganic materials such as silicon dioxide and silicon nitride; and organic materials such as cyclic olefin copolymers, polyimides, parylenes, amorphous fluorocarbon resins, and polyacrylic resins. Such different materials are used depending on the intended use and prescribed properties.

Conventional liquid crystal displays mainly employed inorganic materials, but the replacement of the inorganic materials with organic materials has started. This is because of recent demands for more flexible displays and for reduced cost.

The inorganic materials form insulating films by vapor deposition technique. In contrast, advantageously, the organic materials can form insulating films (insulating coats) easily and inexpensively by coating technique, allow the resulting insulating films to be lightweight and flexible, and are superior in these points to the inorganic materials. These advantages enable the formation of large-area electronic devices on a mass scale rapidly and inexpensively by coating technique (Non Patent Literature (NPL) 1). As an example of the electronic devices, organic thin film transistors are considered to be producible each by a total of four printing processes including 1) printing of a gate electrode, 2) printing of a gate insulating film, 3) printing of a semiconductor, and 4) printing of source/drain electrodes.

Formulation of the organic materials into inks or pastes is of significance in production of electronic devices by coating technique. Disadvantageously, however, the polyimides have low solubility in solvents. Polyamic acids, which are precursors of the polyimides, have high solubility in solvents, but require heating at high temperatures to be converted into polyimides (Patent Literature (PTL) 1). Disadvantageously, this damages a substrate or a material on which printing is performed.

The parylenes require thermal decomposition by heating so as to form coat layers (PTL 2) and are unsuitable for the production of electronic devices by coating technique.

The amorphous fluorocarbon resins can form coat layers by coating technique. The resulting coat layers, however, have poor wettability and impede the formation of an upper layer thereon by coating technique. This disadvantage has been solved typically by a method of forming an upper layer such as an electrode or an organic semiconductor by vapor deposition technique; a method of performing a coating process of an amorphous fluorocarbon resin after the formation of the upper layer; or a method of forming an adhesion layer of an inorganic material on the coat layer of an amorphous fluorocarbon resin, and then forming an upper layer on the adhesion layer (PTL 3). Disadvantageously, however, these methods require another extra technique in addition to the coating technique to produce electronic devices, or subject to constraints in shapes of the electronic devices.

In contrast, the cyclic olefin copolymers have high wettability with solvents. In addition, the cyclic olefin copolymers each have a low relative permittivity and a high insulation resistance. Disadvantageously, however, the cyclic olefin copolymers have poor solubility in solvents and tend to be precipitated or phase-separated even when formulated into inks. As a possible solution to improve the solubility, a method of chemically modifying cyclic olefin copolymers is known. Disadvantageously, however, the chemical modification causes deterioration of insulation performance (PTL 4 and PTL 5).

Examples of solvents mainly used for the formulation of the organic materials into inks include toluene, xylenes, tetrahydrofuran, dioxane, N,N-dimethylformamide, N-methylpyrrolidone, cyclohexanone, and ethylene glycol ethers. These solvents are, however, excessively highly volatile and thereby impede leveling of the coat layer surface. In addition, the solvents are listed as substances to be controlled as substances of very high concern (SVHC) and are hardly usable industrially. The solvents therefore require substitutes.

CITATION LIST

Patent Literature

PTL 1: Japanese Unexamined Patent Application Publication (JP-A) No. 2012-064662
PTL 2: JP-A No. 2010-283332
PTL 3: JP-A No. 2010-278173
PTL 4: JP-A No. 2008-111033
PTL 5: JP-A No. 2009-167433

Non Patent Literature

NPL 1: SUGANUMA, Katsuaki and TANAAMI, Hiroshi, Printed Electronics Technology (ISBN 978-4-7693-1280-2)

SUMMARY OF INVENTION

Technical Problem

Accordingly, the present invention has an object to provide an insulating coating composition as follows. The composition includes an organic material to form an insulating film, and a solvent in which the organic material is dissolved highly stably. The composition is also highly safe. The composition can form an insulating film by coating technique, where the insulating film has a low relative permittivity, a high insulation resistance, and such high wettability as to allow an upper layer to be formed thereon by coating technique.

Solution to Problem

After intensive investigations to achieve the objects, the inventors of the present invention found that a cyclic olefin copolymer in combination with a specific safe solvent can stably form an ink which is suitable for coating technique; and that the ink, when applied, can form an insulating film which has a low relative permittivity and a high insulation resistance and which has such wettability as to allow an upper layer to be formed thereon by coating technique. The present invention has been made on the basis of these findings.

Specifically, the present invention provides an insulating coating composition, where the composition contains a cyclic olefin copolymer and a solvent. The cyclic olefin copolymer is a copolymer between a cyclic olefin and a chain olefin. The solvent includes a compound being represented by Formula (1) and having a normal boiling point of from 100° C. to lower than 300° C. Formula (1) is expressed as follows:

[Chem. 1]

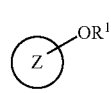

(1)

where Ring Z is a ring selected from a 5- or 6-membered saturated or unsaturated cyclic hydrocarbon and a benzene ring; and $R^1$ is selected from a hydrocarbon group and acyl. Ring Z has one or more substituents including the $R^1O$ group. When Ring Z has two or more substituents, two of the substituents may be linked to each other to form a ring with a carbon atom or atoms constituting Ring Z.

In the insulating coating composition, the cyclic olefin copolymer may be a copolymer between a $C_2$-$C_8$ chain α-olefin and at least one of optionally substituted norbornene and optionally substituted cyclododecene.

In the insulating coating composition, the solvent may include at least one compound selected from the group consisting of cyclohexyl methyl ether, cyclohexanol acetate, methoxybenzene, ethoxybenzene, and cyclopentyl methyl ether.

The insulating coating composition may have a viscosity of 0.1 to 5000 mPa·s at a temperature of 25° C. and a shear rate of 10 $s^{-1}$.

Specifically, the present invention relates to followings.

(1) The present invention relates to an insulating coating composition, where the composition contains a cyclic olefin copolymer and a solvent. The cyclic olefin copolymer is a copolymer between a cyclic olefin and a chain olefin. The solvent includes a compound being represented by Formula (1) and having a normal boiling point of from 100° C. to lower than 300° C. In Formula (1), Ring Z is a ring selected from a 5- or 6-membered saturated or unsaturated cyclic hydrocarbon and a benzene ring; and $R^1$ is selected from a hydrocarbon group and acyl. Ring Z has one or more substituents including the $R^1O$ group. When Ring Z has two or more substituents, two of the substituents may be linked to each other to form a ring with a carbon atom or atoms constituting Ring Z.

(2) In the insulating coating insulating coating composition according to (1), the cyclic olefin copolymer contains a monomer unit derived from the cyclic olefin in a content of 50 to 90 weight percent of the total weight of the cyclic olefin copolymer, and a monomer unit derived from the chain olefin in a content of 10 to 50 weight percent of the total weight of the cyclic olefin copolymer.

(3) In the insulating coating composition according to one of (1) and (2), the cyclic olefin copolymer may contain the monomer unit derived from the cyclic olefin and the monomer unit derived from the chain olefin in a total content of 50 weight percent or more of the total weight of the cyclic olefin copolymer.

(4) In the insulating coating composition according to any one of (1) to (3), the cyclic olefin copolymer may have a glass transition temperature of 40° C. to 220° C. as measured in conformity with ISO 11375-1, -2, and -3.

(5) In the insulating coating composition according to any one of (1) to (4), the cyclic olefin copolymer may have a weight-average molecular weight of 3000 to 200000 as measured by GPC and calibrated with a polystyrene standard.

(6) In the insulating coating composition according to any one of (1) to (5), the cyclic olefin copolymer may be a copolymer between a $C_2$-$C_8$ chain α-olefin and at least one of optionally substituted norbornene and optionally substituted cyclododecene.

(7) The insulating coating composition according to any one of (1) to (6) may be an insulating coating composition containing a solute including the cyclic olefin copolymer, and the solvent, where the solute contains the cyclic olefin copolymer in a proportion of 50 weight percent or more of the total weight of the solute contained in the insulating coating composition.

(8) In the insulating coating composition according to any one of (1) to (7), the solvent may include at least one compound selected from the group consisting of cyclohexyl methyl ether, cyclohexanol acetate, methoxybenzene, ethoxybenzene, and cyclopentyl methyl ether.

(9) In the insulating coating composition according to any one of (1) to (8), the solvent may contain the compound being represented by Formula (1) and having a normal boiling point of from 100° C. to lower than 300° C. in an amount of 50 weight percent or more of the total weight of the solvent contained in the insulating coating composition.

(10) In the insulating coating composition according to one of (8) and (9), the solvent may contain at least one compound selected from the group consisting of cyclohexyl methyl ether, cyclohexanol acetate, methoxybenzene, ethoxybenzene, and cyclopentyl methyl ether in an amount of 50 weight percent or more of the total weight of the solvent contained in the insulating coating composition.

(11) The insulating coating composition according to any one of (1) to (10) may contain the solvent in a proportion of 60 weight percent or more of the total weight of the insulating coating composition.

(12) The insulating coating composition according to any one of (1) to (11) may contain the compound represented by Formula (1) in a proportion of 30 weight percent or more of the total weight of the insulating coating composition.

(13) The insulating coating composition according to any one of (1) to (12) may contain the solute in a proportion of 0.05 to 40.00 weight percent of the total weight of the insulating coating composition.

(14) The insulating coating composition according to any one of (1) to (13) may contain the cyclic olefin copolymer in a proportion of 0.05 to 40.00 weight percent of the total weight of the insulating coating composition.

(15) The insulating coating composition according to any one of (1) to (14) may have a viscosity of 0.1 to 5000 mPa·s at a temperature of 25° C. and a shear rate of 10 $s^{-1}$.

(16) The present invention also relates to a coat layer including a cured product of the insulating coating composition according to any one of (1) to (15).

(17) The coat layer according to (16) may have a contact angle with water of less than 90°.

(18) The coat layer according to one of (16) and (17) may have a surface roughness (arithmetic mean surface roughness; Ra) of 1 nm or less.

(19) The coat layer according to any one of (16) to (18) may have an insulation resistance of 9 kV/0.1 mm or more as measured in conformity with JIS C2110.

(20) The coat layer according to any one of (16) to (19) may have a relative permittivity of 2.7 or less as measured in conformity with IEC 60250 at 1 to 10 kHz and 25° C.

Advantageous Effects of Invention

The insulating coating composition according to the present invention is highly safe and is highly stable as an ink. The composition, when applied and dried, can form an insulating film which has a lower relative permittivity and a higher insulation resistance as compared with conventional equivalents and which has such high wettability as to allow an upper layer to be formed thereon by coating technique. The composition is therefore advantageously usable in applications in which electronic devices including insulating films are formed by coating technique. Non-limiting examples of the electronic devices include transistors, capacitors, inductors, thermistors, and piezoelectric devices.

DESCRIPTION OF EMBODIMENTS

Solvent

The insulating coating composition according to the present invention contains a solvent including a compound represented by Formula (1):
[Chem. 2]

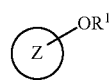

(1)

where Ring Z is a ring selected from a 5- or 6-membered saturated or unsaturated cyclic hydrocarbon and a benzene ring; and $R^1$ is selected from a hydrocarbon group and acyl. Ring Z has one or more substituents including the $R^1O$ group. When Ring Z has two or more substituents, two of the substituents may be linked to each other to form a ring with a carbon atom or atoms constituting Ring Z.

In the formula, Ring Z is a ring selected from a 5- or 6-membered saturated or unsaturated cyclic hydrocarbon and a benzene ring. Non-limiting examples of the 5- or 6-membered saturated or unsaturated cyclic hydrocarbon include cycloalkanes such as cyclopentane and cyclohexane; and cycloalkenes (including cycloalkadienes) such as cyclopentene, cyclopentadiene, cyclohexene, and cyclohexadiene.

$R^1$ is selected from a hydrocarbon group (—R' group) and acyl (—C(=O)R' group). The group R' is a hydrocarbon group and examples thereof include aliphatic hydrocarbon groups, alicyclic hydrocarbon groups, aromatic hydrocarbon groups, and groups each including them bonded to each other.

Non-limiting examples of the aliphatic hydrocarbon groups include alkyls containing 1 to about 20 (preferably 1 to 10, and particularly preferably 1 to 3) carbon atoms, such as methyl, ethyl, propyl, isopropyl, butyl, isobutyl, s-butyl, t-butyl, pentyl, hexyl, decyl, and dodecyl; alkenyls containing 2 to about 20 (preferably 2 to 10, and particularly preferably 2 or 3) carbon atoms, such as vinyl, allyl, and 1-butenyl; and alkynyls containing 2 to about 20 (preferably 2 to 10, and particularly preferably 2 or 3) carbon atoms, such as ethynyl and propynyl.

Non-limiting examples of the alicyclic hydrocarbon groups include cycloalkyls containing 3 to about 20 members (preferably 3 to 15 members, and particularly preferably 5 to 8 members) such as cyclopropyl, cyclobutyl, cyclopentyl, cyclohexyl, and cyclooctyl; cycloalkenyls containing 3 to about 20 members (preferably 3 to 15 members, and particularly preferably 5 to 8 members) such as cyclopentenyl and cyclohexenyl; and bridged hydrocarbon groups containing 4 to about 20 members, such as perhydronaphth-1-yl, norbornyl, adamantyl, tricyclo[5.2.1.0$^{2,6}$]dec-8-yl, and tetracyclo[4.4.0.1$^{2,5}$.1$^{7,10}$]dodec-3-yl.

Non-limiting examples of the aromatic hydrocarbon groups include aromatic hydrocarbon groups containing about 6 to about 14 (preferably 6 to 10) carbon atoms, such as phenyl and naphthyl.

Among them, R' is preferably selected from $C_1$-$C_{20}$ alkyls, $C_1$-$C_{20}$ aliphatic acyls, and $C_6$-$C_{14}$ aromatic acyls.

Ring Z has a substituent or substituents including the $R^1O$ group (the group specified in Formula (1)) and may have one or more substituents other than the $R^1O$ group. Non-limiting examples of the other substituents include halogens, oxo, hydroxy, substituted oxys (such as $C_1$-$C_4$ alkoxys, $C_6$-$C_{10}$ aryloxys, $C_7$-$C_{16}$ aralkyloxys, and $C_1$-$C_4$ acyloxys), carboxy, substituted oxycarbonyls (such as $C_1$-$C_4$ alkoxy-carbonyls, $C_6$-$C_{10}$ aryloxy-carbonyls, and $C_7$-$C_{16}$ aralkyloxy-carbonyls), substituted or unsubstituted carbamoyls, cyano, nitro, substituted or unsubstituted aminos, sulfo, heterocyclic groups (such as groups resulting from removing one hydrogen atom each from the structural formulae of after-mentioned heterocyclic rings), alkyls (such as methyl, ethyl, and other $C_1$-$C_4$ alkyls), alkenyls (such as vinyl, allyl, 1-butenyl, and other $C_2$-$C_4$ alkenyls), alkynyls (such as ethynyl, propynyl, and other $C_2$-$C_4$ alkynyls), $C_3$-$C_8$ cycloalkyls, and aryls (such as phenyl, naphthyl, and other $C_6$-$C_{10}$ aryls).

Two of the substituents may be linked to each other to form a ring with a carbon atom or atoms constituting Ring Z. Examples of the ring include aliphatic rings, aromatic rings, and heterocyclic rings.

Non-limiting examples of the aliphatic rings include cycloalkane rings containing 3 to about 20 members (preferably 3 to 15 members, and particularly preferably 5 to 8 members), such as cyclopropane, cyclobutane, cyclopentane, cyclohexane, and cyclooctane rings; cycloalkene rings containing 3 to about 20 members (preferably 3 to 15 members, and particularly preferably 5 to 8 members), such as cyclopentene and cyclohexene rings; and bridged hydrocarbons containing 4 to about 20 members, such as perhydronaphthalene, norbornane, adamantane, tricyclo[5.2.1.0$^{2,6}$]decane, and tetracyclo[4.4.0.1$^{2,5}$.1$^{7,10}$]dodecane rings.

Non-limiting examples of the aromatic rings include aromatic hydrocarbons containing 6 to about 14 (preferably 6 to 10) carbon atoms, such as benzene and naphthalene.

Non-limiting examples of the heterocyclic rings include aromatic heterocyclic compounds and non-aromatic heterocyclic compounds exemplified by oxygen-containing heterocyclic rings, sulfur-containing heterocyclic rings, and nitrogen-containing heterocyclic rings, where oxygen, sulfur, and nitrogen are heteroatoms. Non-limiting examples of the oxygen-containing heterocyclic rings include 3-membered rings such as oxirane ring; 4-membered rings such as oxetane ring; 5-membered rings such as furan, tetrahydrofuran, oxazole, isoxazole, and γ-butyrolactone rings; 6-membered rings such as 4-oxo-4H-pyran, tetrahydropyran, and morpholine rings; fused rings such as benzofuran, isobenzofuran, 4-oxo-4H-chromene, chroman, and isochroman rings; and bridged rings such as 3-oxatricyclo[4.3.1.1$^{4,8}$]undecan-2-one and 3-oxatricyclo[4.2.1.0$^{4,8}$]

nonan-2-one rings. Non-limiting examples of the sulfur-containing heterocyclic rings include 5-membered rings such as thiophene, triazole, isothiazole, and thiadiazole rings; 6-membered rings such as 4-oxo-4H-thiopyran ring; and fused rings such as benzothiophene ring. Non-limiting examples of the nitrogen-containing heterocyclic rings include 5-membered rings such as maleimide, pyrrole, pyrrolidine, pyrazole, imidazole, and triazole rings; 6-membered rings such as isocyanurate, pyridine, pyridazine, pyrimidine, pyrazine, piperidine, and piperazine rings; and fused rings such as indole, indoline, quinoline, acridine, naphthyridine, quinazoline, purine, and carbazole rings.

The compound represented by Formula (1) has a normal boiling point of from 100° C. to lower than 300° C., preferably 100° C. to 280° C., particularly preferably 100° C. to 250° C., and most preferably 100° C. to 200° C. The compound, if having a normal boiling point lower than the range, has excessively high volatility and tends to impede the composition from having a stably maintained viscosity upon coating operation and from forming a smooth coat layer.

The compound represented by Formula (1) preferably includes at least one compound selected from cyclohexyl methyl ether, cyclohexanol acetate, methoxybenzene, ethoxybenzene, and cyclopentyl methyl ether. These compounds are preferred because they are highly safe, can dissolve the cyclic olefin copolymer satisfactorily, have appropriate volatility, and can form a highly smooth coat layer.

The solvent in the insulating coating composition according to the present invention may further contain a compound other than the compounds represented by Formula (1), within ranges not adversely affecting the advantageous effects of the present invention. Non-limiting examples of the compound other than the compounds represented by Formula (1) include (poly)alkylene glycol monoalkyl ethers such as ethylene glycol monomethyl ether, ethylene glycol monoethyl ether, ethylene glycol n-propyl ether, ethylene glycol n-butyl ether, diethylene glycol monomethyl ether, diethylene glycol monoethyl ether, diethylene glycol n-propyl ether, diethylene glycol n-butyl ether, triethylene glycol monomethyl ether, triethylene glycol monoethyl ether, propylene glycol monomethyl ether, propylene glycol monoethyl ether, propylene glycol n-propyl ether, propylene glycol n-butyl ether, dipropylene glycol monomethyl ether, dipropylene glycol monoethyl ether, dipropylene glycol n-propyl ether, dipropylene glycol n-butyl ether, tripropylene glycol monomethyl ether, and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, and propylene glycol monoethyl ether acetate; (poly)alkylene glycol dialkyl ethers such as diethylene glycol dimethyl ether, diethylene glycol diethyl ether, diethylene glycol methyl ethyl ether, and dipropylene glycol dimethyl ether; ethers such as tetrahydrofuran; ketones such as methyl ethyl ketone, cyclohexanone, 2-heptanone, and 3-heptanone; lactic acid alkyl esters such as methyl 2-hydroxypropionate and ethyl 2-hydroxypropionate; esters such as ethyl 2-hydroxy-2-methylpropionate, methyl 3-methoxypropionate, ethyl 3-methoxypropionate, ethyl ethoxyacetate, ethyl hydroxyacetate, methyl 2-hydroxy-3-methylbutanoate, 3-methyl-3-methoxybutyl acetate, 3-methoxy-3-methoxybutyl propionate, ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylenes; and amides such as N-methylpyrrolidone, N,N-dimethylformamide, N,N-dimethylacetamide, and tetramethylurea. The composition may contain each of them alone or in combination.

The solvent in the insulating coating composition according to the present invention may include the compound represented by Formula (1) in a proportion of typically 50 weight percent or more, preferably 70 weight percent or more, and particularly preferably 90 weight percent or more, of the total weight of the solvent. When the solvent includes two or more compounds represented by Formula (1), the term "proportion" refers to the total proportion of them. The solvent, when including the compound represented by Formula (1) in a proportion less than the range, tends to cause deterioration in dissolution stability of the cyclic olefin copolymer and in safety.

Solute

The insulating coating composition according to the present invention contains a solute including a cyclic olefin copolymer which is a copolymer between a cyclic olefin and a chain olefin.

The cyclic olefin may be selected from polycyclic olefins and monocyclic olefins. Each of them may be used alone or in combination.

The polycyclic olefins are preferably selected from polycyclic olefins containing 4 to about 20 carbon atoms and are exemplified by, but not limited to, polycyclic hydrocarbons containing a carbon-carbon double bond in the ring, as exemplified by bicyclic olefins such as norbornene and norbornadiene; tricyclic olefins such as dicyclopentadiene and 5,6-dihydrodicyclopentadiene; and tetracyclic olefins such as tetracyclododecene. Among them, bridged hydrocarbons (including bridged dienes) are typified.

The monocyclic olefins are preferably selected from monocyclic olefins containing 3 to about 20 carbon atoms and are exemplified by, but not limited to, monocyclic hydrocarbons containing a carbon-carbon double bond in the ring, such as cyclobutene, cyclopentene, cyclopentadiene, cyclooctene, and cyclododecene. Among them, cycloalkenes (including cycloalkadienes) are typified.

The polycyclic or monocyclic olefins may each have one or more substituents. Non-limiting examples of the substituents are as with the substituents which Ring Z in Formula (1) may have.

Non-limiting examples of the chain olefin include $C_2$-$C_8$ alkenes (including alkadienes) such as ethylene, propylene, 1-butene, 2-butene, isobutene, 1-pentene, 2-pentene, 1-hexene, 2-hexene, 3-hexene, 1-heptene, 1-octene, 2-octene, 3-octene, 4-octene, 1-nonene, 1-decene, 1-dodecene, 1,5-hexadiene, 1,6-heptadiene, and 1,7-octadiene; and aromatic vinyl compounds such as styrene, α-methylstyrene, m-vinyltoluene, p-vinyltoluene, and 1-vinylnaphthalene.

The cyclic olefin copolymer for use in the present invention may be obtained by copolymerizing a monomer mixture including the cyclic olefin and the chain olefin in the presence of a metathesis polymerization catalyst. The copolymerization may be performed by a procedure selected from random copolymerization, block copolymerization, alternating copolymerization, and graft copolymerization.

The cyclic olefin copolymer may contain the monomer unit derived from the cyclic olefin in a content of typically 50 to 90 weight percent, and preferably 60 to 85 weight percent, of the total weight of the cyclic olefin copolymer.

The cyclic olefin copolymer may contain the monomer unit derived from the chain olefin in a content of typically 10 to 50 weight percent, and preferably 15 to 40 weight percent, of the total weight of the cyclic olefin copolymer.

The cyclic olefin copolymer may contain the monomer unit derived from the cyclic olefin and the monomer unit derived from the chain olefin in a total content of typically 50 weight percent or more, preferably 60 weight percent or more, more preferably 70 weight percent or more, furthermore preferably 80 weight percent or more, and most preferably 90 weight percent or more, of the total weight of the cyclic olefin copolymer. The cyclic olefin copolymer, when containing the monomer unit derived from the cyclic olefin and the monomer unit derived from the chain olefin in a total content controlled within the range, can have a controlled glass transition temperature.

The cyclic olefin copolymer preferably has a glass transition temperature of typically 40° C. to 220° C., and particularly 60° C. to 200° C., as determined in conformity with ISO 11375-1, -2, and -3. This is preferred for excellent heat resistance and workability.

The cyclic olefin copolymer may have a weight-average molecular weight of typically 3000 to 200000, and preferably 5000 to 150000, as measured by GPC and calibrated with a polystyrene standard.

The cyclic olefin copolymer for use in the present invention is preferably selected from copolymers between a cyclic olefin and a chain α-olefin; particularly preferably selected from copolymers between a $C_2$-$C_8$ chain α-olefin and at least one of optionally substituted norbornene and optionally substituted cyclododecene; and especially preferably selected from copolymers between a $C_2$-$C_8$ chain α-olefin and optionally substituted norbornene (i.e., copolymers containing a monomer unit represented by Formula (2) and derived from the optionally substituted norbornene, and a monomer unit represented by Formula (3) and derived from the $C_2$-$C_8$ chain α-olefin). Formulae (2) and (3) are expressed as follows:

[Chem. 3]

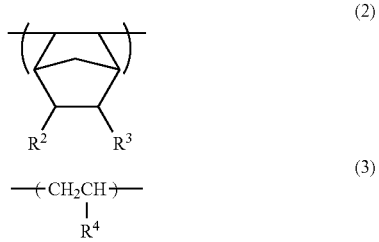

In Formula (2), $R^2$ and $R^3$ are each, identically or differently, selected from hydrogen and the above-exemplified substituents. $R^2$ and $R^3$ may be linked to each other to form a ring with carbon atoms constituting the norbornene ring. Non-limiting examples of the ring are as with the ring which may be formed by two of the substituents in Formula (1) linked to each other, with a carbon atom or atoms constituting Ring Z.

In Formula (3), $R^4$ is selected from hydrogen atom and $C_1$-$C_6$ alkyl.

The cyclic olefin copolymer for use in the present invention may be advantageously selected from commercial products available typically under the trade names of TOPAS (from Polyplastics Co., Ltd.); and APEL (from Mitsui Chemicals Inc.).

The solute in the insulating coating composition according to the present invention may further include one or more compounds other than the cyclic olefin copolymers, within ranges not adversely affecting the advantageous effects of the present invention. Non-limiting examples of the other compounds include cyclic olefin polymers, polyimides, parylenes, amorphous fluorocarbon resins, and polyacrylic resins. Even the above case, however, the solute contained in the insulating coating composition according to the present invention may include the cyclic olefin copolymer in a proportion of typically 50 weight percent or more, preferably 70 weight percent or more, and particularly preferably 90 weight percent or more, of the total weight of the solute. When the solute contains two or more cyclic olefin copolymers, the term "proportion" refers to the total proportion of them.

Insulating Coating Composition

The insulating coating composition (composition for insulating film formation) according to the present invention may be produced by mixing the solvent and the solute with each other with stirring typically at 20° C. to 120° C. for about 0.5 to about 48 hours.

The insulating coating composition according to the present invention may contain the solvent in a proportion of typically 60 weight percent or more (e.g., 60.00 to 99.95 weight percent), preferably 70 weight percent or more (e.g., 70.0 to 99.9 weight percent), and particularly preferably 80 weight percent or more (e.g., 80.0 to 99.9 weight percent), of the total weight of the composition.

The insulating coating composition according to the present invention may contain the compound represented by Formula (1) in a proportion of typically 30 weight percent or more (e.g., 30.00 to 99.95 weight percent), preferably 35 weight percent or more (e.g., 35.0 to 99.9 weight percent), more preferably 40 weight percent or more (e.g., 40.0 to 99.9 weight percent), particularly preferably 50 weight percent or more (e.g., 50.0 to 99.9 weight percent), still more preferably 60 weight percent or more (e.g., 60.0 to 99.9 weight percent), and furthermore preferably 75 weight percent or more (e.g., 75.0 to 99.9 weight percent), of the total weight of the composition. When the composition contains two or more different cyclic olefin copolymers, the term "proportion" refers to the total proportion of them.

The insulating coating composition according to the present invention may contain the solute in a proportion of typically 0.05 weight percent or more (e.g., 0.05 to 40.00 weight percent), and preferably 0.1 weight percent or more (e.g., 0.1 to 30.0 weight percent), of the total weight of the composition.

The insulating coating composition according to the present invention may contain the cyclic olefin copolymer in a proportion of typically 0.05 weight percent or more (e.g., 0.05 to 40.00 weight percent), and preferably 0.1 weight percent or more (e.g., 0.1 to 30.0 weight percent), of the total weight of the composition.

The insulating coating composition according to the present invention has a low viscosity and thereby offers excellent coatability. The composition has a viscosity of typically 0.1 to 5000 mPa·s, and preferably 1 to 1000 mPa·s at a temperature of 25° C. and a shear rate of 10 s$^{-1}$. The viscosity may be measured using a rheometer (trade name PHYSICA UDS200, supplied by Anton Paar).

The insulating coating composition according to the present invention can form a coat layer by coating and drying. The coating may be performed by a common technique such as spin coating, dip coating, or spraying. The drying may be performed typically at about 20° C. to about 120° C. for about 0.1 to about 5 minutes. The insulating coating composition according to the present invention is excellently capable of forming a coat layer having a various thickness, from a thin film to a thick film and allows the resulting coat layer to have a homogeneous thickness of 2500 nm or less (e.g., 10 to 2500 nm).

The coat layer obtained from the insulating coating composition according to the present invention via coating and drying has high wettability and has a contact angle with water of less than 90° (preferably from 10° to less than 90°, particularly preferably from 30° to less than 90°, and most preferably from 60° to less than 90°). This allows an upper layer to be formed thereon by coating technique.

The insulating coating composition according to the present invention resists phase separation and is highly stable as an ink. This allows the resulting coat layer to have excellent surface smoothness. Thus, the coat layer may have a surface roughness (arithmetic mean surface roughness; $R_a$) of 1 nm or less (e.g., 0.05 to 1 nm).

The coat layer obtained from the insulating coating composition according to the present invention via coating and drying has a high insulation resistance of typically 9 kV/0.1 mm or more, and preferably 10 kV/0.1 mm or more, as determined in conformity with JIS C2110.

The coat layer obtained from the insulating coating composition according to the present invention via coating and drying has a low relative permittivity of typically 2.7 or less (e.g., 1.5 to 2.7), preferably 2.5 or less (e.g., 1.5 to 2.5) as determined at 1 to 10 kHz and 25° C. in conformity with IEC 60250.

The insulating coating composition according to the present invention can form a coat layer having the properties by coating technique. The resulting coat layer has such high wettability as to allow an upper layer to be formed thereon by coating technique. The composition is therefore advantageously usable in applications in which electronic devices including large-area insulating films are formed on a mass scale rapidly and inexpensively.

EXAMPLES

The present invention will be illustrated in further detail with reference to several examples below. It should be noted, however, that the examples are by no means intended to limit the scope of the present invention. All boiling points are boiling points at 1 atmospheric pressure, namely, normal boiling points, unless otherwise specified.

Example 1

In a 100-mL sample vial, 50.0 g of solvent cyclopentyl methyl ether were weighed, to which 0.050 g of a precisely weighed solute cyclic olefin copolymer (copolymer between norbornene and ethylene) was added. The mixture was heated up to 100° C. with stirring using a stirring bar, further continuously stirred under this condition for 36 hours, and yielded insulating coating compositions. The cyclic olefin copolymer herein was selected from trade names TOPAS 5013S-04 (Tg: 134° C.), TOPAS 6013S-04 (Tg: 138° C.), and TOPAS 7010XITI (each available from Polyplastics Co., Ltd.).

The resulting insulating coating compositions were visually observed at room temperature (25° C.). A sample in which the cyclic olefin copolymer was completely dissolved was evaluated as having good solubility and indicated as "Good", and a sample suffering from precipitates and/or becoming cloudy was evaluated as having poor solubility and indicated as "Poor".

Independently, a sample using a solvent which is not a subject to legal controls was evaluated as having good safety and indicated as "Good", and a sample using a solvent which is a subject to legal controls was evaluated as having poor safety and indicated as "Poor".

Examples 2 to 5 and Comparative Examples 1 to 16

The procedure of Example 1 was performed, except for using any of the compounds given in the following tables as a solvent instead of cyclopentyl methyl ether.

TABLE 1

| | Solvent | | | Solute TOPAS solubility | | |
|---|---|---|---|---|---|---|
| | Compound name | Boiling point (° C.) | Safety | 5013S-04 | 6013S-04 | 7010XITI |
| Example 1 | Cyclopentyl methyl ether | 106 | Good | Good | Good | Good |
| Example 2 | Cyclohexyl methyl ether | 135 | Good | Good | Good | Good |
| Example 3 | Methoxybenzene | 154 | Good | Good | Good | Good |
| Example 4 | Ethoxybenzene | 170 | Good | Good | Good | Good |
| Example 5 | Cyclohexanol acetate | 173 | Good | Good | Good | Good |
| Comparative Example 1 | o-Dichlorobenzene | 180.5 | Poor | Good | Good | Good |
| Comparative Example 2 | Toluene | 110.6 | Poor | Good | Good | Good |
| Comparative Example 3 | 1,2-Dimethylbenzene | 144 | Poor | Good | Good | Good |
| Comparative Example 4 | Pyridine | 115.2 | Poor | Poor | Poor | Poor |
| Comparative Example 5 | Tetrahydrofurfuryl acetate | 195 | Poor | Poor | Poor | Poor |
| Comparative Example 6 | Tetramethylurea | 176 | Poor | Poor | Poor | Poor |
| Comparative Example 7 | Dimethyltetrahydropyrimidinone | 246 | Poor | Poor | Poor | Poor |
| Comparative Example 8 | Tetrahydrobenzyl alcohol | 132 (13.3 kPa) | Poor | Poor | Poor | Poor |
| Comparative Example 9 | Tetrahydrofurfuryl alcohol | 176 | Poor | Poor | Poor | Poor |
| Comparative Example 10 | 1,3-Butanediol | 208 | Poor | Poor | Poor | Poor |
| Comparative Example 11 | Cyclopentanone | 130.6 | Poor | Poor | Poor | Poor |
| Comparative Example 12 | 2-Acetylcyclohexanone | 111 (18 mmHg) | Poor | Poor | Poor | Poor |
| Comparative Example 13 | Dipropylene glycol methyl n-propyl ether | 203 | Poor | Poor | Poor | Poor |
| Comparative Example 14 | α-Acetyl-γ-butyrolactone | 107 | Poor | Poor | Poor | Poor |
| Comparative Example 15 | Diisobutyl ether | 122 | Poor | Poor | Poor | Poor |
| Comparative Example 16 | Methyl isobutyl ketone | 116.2 | Poor | Poor | Poor | Poor |

Example 6

In a 100-mL sample vial, 47.5 g of cyclopentyl methyl ether were weighed, to which 2.5 g of a precisely weighed cyclic olefin copolymer (copolymer between norbornene and ethylene; trade name TOPAS 5013S-04, supplied by Polyplastics Co., Ltd.) was added, followed by heating up to 100° C. with stirring using a stirring bar. The mixture after stirring for 36 hours was naturally cooled down to room temperature and yielded an insulating coating composition.

The resulting insulating coating composition was added dropwise through a 0.5-μm cartridge filter onto a glass substrate and then spin-coated using a spin coater. The spin coating was performed under such conditions that the number of revolutions was increased from 0 rpm to 3000 rpm over 3 seconds, maintained at 3000 rpm for 30 seconds, and decreased down to 0 rpm over 3 seconds. The sample was then dried for 5 minutes on a hot plate heated at 100° C. and yielded a coat layer.

The following properties were measured on the resulting coat layer and found to meet all the specifications (see Table 2).

Thin Film Formability

A part of the coat layer was shaven off with brass. While defining the resulting level difference as a layer thickness, the average surface roughness of the coat layer was measured using a profiler (ET4000A, supplied by Kosaka Laboratory Ltd.).

Contact Angle

The contact angle of the coat layer with pure water was measured at an ambient temperature of 25° C. and a pressure of 1 atmospheric pressure using a contact angle meter (DM-701, supplied by Kyowa Interface Science Co., Ltd.).

Surface Smoothness

The average surface roughness of the coat layer was measured using a scanning probe microscope (SPA400, supplied by SII Nano Technology Inc.).

Insulation Resistance

The insulation resistance was measured on a coat layer having a thickness of 0.1 mm in conformity with JIS C2110.

Relative Permittivity

The relative permittivity was measured in conformity with IEC 60250 in a region of 1 to 10 kHz at an ambient temperature of 25° C.

TABLE 2

| Properties | Specifications | Example 6 Cyclic olefin copolymer coat layer | Referential Example 1 Amorphous fluorocarbon resin coat layer | Referential Example 2 Cyclic olefin polymer coat layer |
|---|---|---|---|---|
| Thin film formability | 250 nm or less | 250 nm or less | 10 μm or less | — |
| Contact angle | less than 90° | 82° to 86° | 56° to 120° | — |
| Surface roughness | 1 nm or less | 1 nm or less | — | — |
| Insulation resistance | 3 MV/cm or more 9 kV/0.1 mm or more | 10 kV/0.1 mm or more | 9 kV/0.1 mm | 6.5 MV/cm |
| Relative permittivity | 2.7 or less | 2.35 | 2.05 | 3.2 |

The data of Referential Example 1 are catalog data of an amorphous fluorocarbon resin coat layer (coat layer derived from the trade name CYTOP (supplied by Asahi Glass Co., Ltd.)); and the data of Referential Example 2 are catalog data of a cyclic olefin polymer coat layer (coat layer derived from the trade name ZEOCOAT (supplied by ZEON CORPORATION)).

The results demonstrated that the insulating coating compositions according to the present invention can form coat layers having excellent surface smoothness by coating technique and that the resulting coat layers offer good electrical properties. The results also demonstrated that the coat layers have such high wettability as to allow an upper layer to be formed thereon by coating typically with an organic semiconductor compound or an electrode material dissolved or dispersed in an organic solvent.

INDUSTRIAL APPLICABILITY

The insulating coating compositions according to the present invention are highly safe and are highly stable as inks. The compositions, when applied and dried, can form insulating films which have a lower relative permittivity and a higher insulation resistance as compared with conventional equivalents and which have such high wettability as to allow an upper layer to be formed thereon by coating technique. The compositions are therefore advantageously usable in applications in which electronic devices including insulating films are formed by coating technique.

The invention claimed is:

1. An insulating coating composition, comprising:
   a cyclic olefin copolymer being a copolymer between a cyclic olefin and a chain olefin; and
   a solvent comprising a compound being represented by Formula (1) and having a normal boiling point of from 100° C. to lower than 300° C., Formula (1) expressed as follows:

(1)

wherein Ring Z is a ring selected from a 5- or 6-membered saturated or unsaturated cyclic hydrocarbon and a benzene ring; and $R^1$ is selected from a hydrocarbon group and acyl, where Ring Z has one or more substituents including $R^1O$ group, and where, when Ring Z has two or more substituents, two of the substituents may be linked to each other to form a ring with a carbon atom or atoms constituting Ring Z, wherein the cyclic olefin copolymer is a copolymer consisting of a monomer unit represented by Formula (2) and derived from optionally substituted norbornene, and a monomer unit represented by Formula (3) and derived from the $C_2$-$C_8$ chain α-olefin, Formulae (2) and (3) are expressed as follows:

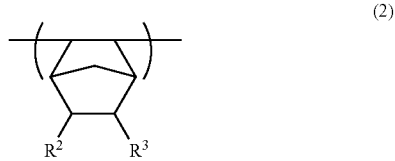

(2)

-continued

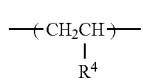
(3)

wherein $R^2$ and $R^3$ are each, identically or differently, selected from hydrogen, halogens, hydroxy, substituted oxys, carboxy, substituted oxycarbonyls, substituted or unsubstituted carbamoyls, cyano, nitro, substituted or unsubstituted aminos, sulfo, heterocyclic groups except for heterocyclic groups containing an oxirane ring, alkyls, alkenyls, alkynyls, $C_3$-$C_8$ cycloalkyls, and aryls and $R^4$ is selected from hydrogen atom and $C_1$-$C_6$ alkyl.

2. The insulating coating composition according to claim 1,
wherein the solvent comprises at least one compound selected from the group consisting of cyclohexyl methyl ether, cyclohexanol acetate, methoxybenzene, ethoxybenzene, and cyclopentyl methyl ether.

3. The insulating coating composition according to claim 1,
wherein the composition has a viscosity of 0.1 to 5000 mPa·s at a temperature of 25° C. and a shear rate of 10 $s^{-1}$.

4. The insulating coating composition according to claim 2,
wherein the composition has a viscosity of 0.1 to 5000 mPa·s at a temperature of 25° C. and a shear rate of 10 $s^{-1}$.

* * * * *